United States Patent [19]
Kawai et al.

[11] Patent Number: 5,764,575
[45] Date of Patent: Jun. 9, 1998

[54] REPLACEMENT SEMICONDUCTOR READ-ONLY MEMORY

[75] Inventors: Tomoyuki Kawai, Tenri; Kouji Inoue, Ikoma, both of Japan

[73] Assignee: Sharp Kabushiki Kaisha, Nagaike-cho, Japan

[21] Appl. No.: 713,460

[22] Filed: Sep. 13, 1996

[30] Foreign Application Priority Data

Sep. 29, 1995 [JP] Japan .................................. 7-254042

[51] Int. Cl.$^6$ .................................................. G11C 7/00
[52] U.S. Cl. .................................... 365/200; 365/230.03
[58] Field of Search .............................. 365/200, 230.03

[56] References Cited

U.S. PATENT DOCUMENTS

| | | | |
|---|---|---|---|
| 4,935,899 | 6/1990 | Morigami | 365/200 |
| 5,075,890 | 12/1991 | Itoh et al. | 365/189.09 |
| 5,132,933 | 7/1992 | Schreck et al. | 365/226 |
| 5,272,672 | 12/1993 | Ogihara | 365/200 |
| 5,278,794 | 1/1994 | Tanaka et al. | 365/200 |
| 5,452,258 | 9/1995 | Hotta | 365/200 |
| 5,485,424 | 1/1996 | Iwai et al. | 365/200 |

FOREIGN PATENT DOCUMENTS

| | | |
|---|---|---|
| 0333207 | 9/1989 | European Pat. Off. |
| 0383452 | 8/1990 | European Pat. Off. |
| 0417484 | 3/1991 | European Pat. Off. |
| 0482880 | 4/1992 | European Pat. Off. |

*Primary Examiner*—Son T. Dinh
*Attorney, Agent, or Firm*—Morrison & Foerster, LLP

[57] ABSTRACT

A semiconductor read-only memory includes a plurality of memory cell groups each having a plurality of memory cells, a first selector for selecting an arbitrary memory cell group from the plurality of memory cell groups, and a second selector for selecting an arbitrary memory cell from the selected memory cell group. The semiconductor read-only memory further includes: an address storage circuit for storing address information of a predetermined memory cell portion in a memory cell group; a data storage circuit for storing memory cell information of the predetermined memory cell portion; and a switching circuit for switching between information stored in the memory cell selected from the memory cell group and the memory cell information stored in the data storage circuit, based on the address information, and outputting either the information stored in the memory cell selected from the memory cell group or the memory cell information stored in the data storage circuit.

7 Claims, 8 Drawing Sheets

REPLACEMENT SEMICONDUCTOR READ-ONLY MEMORY

BACKGROUND OF THE INVENTION

1. Field of the Invention:

The present invention relates to a replacement semiconductor read-only memory (hereinafter, simply referred to as "a semiconductor ROM"). In particular, the present invention relates to a mask ROM to which information is written in the course of production.

2. Description of the Related Art:

In recent years, semiconductor ROMs such as mask ROMs have finer device elements and larger memory capacity, and thus improvement in the production yield thereof becomes a primary issue. In order to improve the production, yields various configurations of mask ROMs have been proposed so far.

A first example is a mask ROM provided with an error-correcting circuit, which has already been put into practical use. A second example is a mask ROM provided with redundant memory cells having the same structural pattern as that of memory cells on a word line basis or on a bit line basis, as used in RAMs or the like. In this example, when a defective memory cell is found in a memory cell array, data to be stored in the defective memory cell is stored in a redundant memory cell.

A mask ROM of the first example is provided with an error-correcting circuit storing error-correcting bits. Therefore, a special time for correcting defects is not required, while a chip area increases by 20% or more. In the second example, a mask ROM is provided with redundant word lines or redundant bit lines, so that it is required to write larger amounts of data in a mask ROM, compared with a RAM or the like. Thus, it has been difficult to achieve such mask ROMs.

In order to solve the above-mentioned problems, U.S. Pat. No. 5,452,258 proposes that memory cells are replaced on a small memory cell group basis, e.g., on a bank basis. This method enables the production yield to be improved almost without increasing a chip area and a time for replacing defective memory cells.

However, the number of memory cells to be replaced in one chip tends to increase along with the increase in memory capacity. This requires more banks compared with the conventional examples. Furthermore, in the case where a memory cell configuration changes along with the change in the device specification, i.e., in the case where the number of memory cells per bank increases, compared with conventional devices, the area of data storing means for replacing defective memory cells increases. This, in turn, increases the size of a chip. In such a circuit for replacing defective memory cells, the wiring delay is large, which might induce the delay of the access time.

FIG. 8 is a block diagram of a conventional mask ROM. The mask ROM shown in FIG. 8 includes a memory cell array $1a$, a row decoder 2, e column decoder 3, a sense amplifier 4, word lines $WL_1$ to $WL_n$, a switching circuit 70, a replacement bank address storage circuit 80, a replacement data storage circuit 90, and a replacement data bit designating storage circuit 100.

FIG. 1 shows a detailed circuit configuration of the memory cell array $1a$.

The memory cell array $1a$ has memory cell groups i.e., banks (represented by broken lines in the figure) $B_{m,2i-1}$, $B_{m+1,2i-1}$ ... and $B_{m,2i}$, $B_{m+1,2i}$ ... formed by partitioning each column of memory cells in the column direction. Sub-bit lines (first bit lines) $SB_{m,2i-2}$, $SB_{m,2i-1}$, $SB_{m,2i}$ ... made of diffusion layers are formed between the respective banks $B_{m,2i-1}$, $B_{m,2i}$ ... arranged in the row direction. Each sub-bit line is connected to each memory cell (transistor) M in the respective banks.

The sub-bit lines $SB_{m,2i-2}$, $SB_{m,2i-1}$, $SB_{m,2i}$ ... are connected to main bit lines (second bit lines) $MB_{i-1}$, $MB_i$, $MB_{i+1}$ ... through MOSFETS for bank selection (transfer gate transistors) $QO_{m,2i-2}$, $QO_{m,2i-1}$, $QO_{m,2i}$ ... The main bit lines $MB_{i-1}$, $MB_i$, $MB_{i+1}$ ... are made of low resistant metal layers. One main bit line (e.g., $MB_i$) is connected to two sub-bit lines ($SB_{m,2i-1}$ and $SB_{m,2i}$).

A bank selection line $BO_m$ is connected to gates of the respective MOSFETS for bank selection $QO_{m,2i-2}$, $QO_{m,2i-1}$, $QO_{m,2i}$ ... Word lines $WL_1$ to $WL_n$ are connected to gates of the respective memory cells M. The sub-bit lines $SB_{m,2i-2}$, $SB_{m,2i-1}$, $SB_{m,2i}$ ... are connected to MOSFETS for bank selection $QE_{m,2i-1}$, $QE_{m,2i}$ ... each gate of which is connected to a bank selection line $BE_m$. The main bit lines $MB_{i-1}$ and $MB_{i+1}$ are grounded through transistors $Q_{i-1}$, $Q_{i+1}$ ... and the main bit $MB_i$ is connected to a sense amplifier for sensing data.

In the case where a defective memory cell is connected to a sub-bit line shown in FIG. 1, address information for designating a bank to which the defective memory cell is connected is previously written in the replacement bank address storage circuit 80. Address information is written in the replacement bank address storage circuit 80 by physically cutting a plurality of fuse elements of the replacement bank address storage circuit 80, for example, by using a laser beam. For example, when a memory cell connected to a bank is accessed, an output signal of the replacement bank address storage circuit 80 becomes active. In response to the output signal, information previously written in the replacement data storage circuit 90 is output through the switching circuit 70.

The following advantages are obtained by replacing a defective memory cell on a bank basis as described above.

The number of cutting portions of the fuse elements with a laser beam decreases, compared with the case where a defective memory cell is replaced on a word line basis or on a bit line basis. Furthermore, the time required for cutting the fuse elements with a laser beam is substantially shorter.

However, when the number of bits to be replaced increases along with the increase in capacity of a mask ROM, the memory capacities of storage circuits, such as an address storage circuit for replacing a defective memory cell, must also increase. This, in turn, increases the area of each storage circuit and causes a wiring delay no matter how the storage circuits are configured. Furthermore, a conventional mask ROM with a large capacity may suffer from an access time delay in accessing itself.

The memory cell array as shown in FIG. 1 is divided into a plurality of banks, each having a plurality of memory cells. In such a memory cell array, when a defect occurs in a diffusion layer of a sub-bit line, all the memory cells connected to the defective diffusion layer become defective. In this case, a bank connected to the defective diffusion layer is replaced. However, in the case where a defective memory cell is not related to a defect of the diffusion layer, more specifically, in the case where the defect of a memory cell is caused only by the memory cell itself, the replacement of only the defective memory cell suffices. It is not necessary to replace memory cells on a bank basis.

SUMMARY OF THE INVENTION

A semiconductor read-only memory of the present invention includes a plurality of memory cell groups each having a plurality of memory cells, a first selector for selecting an arbitrary memory cell group from the plurality of memory cell groups, and a second selector for selecting an arbitrary memory cell from the selected memory cell group. The semiconductor read-only memory further includes: an address storage circuit for storing address information of a predetermined memory cell portion in a memory cell group; a data storage circuit for storing memory cell information of the predetermined memory cell portion; and a switching circuit for switching between information stored in the memory cell selected from the memory cell group and the memory cell information stored in the data storage circuit, based on the address information, and outputting either the information stored in the memory cell selected from the memory cell group or the memory cell information stored in the data storage circuit.

A semiconductor read-only memory of the present invention includes a plurality of memory cell groups each having a plurality of memory cells, a first selector for selecting an arbitrary memory cell group from the plurality of memory cell groups, and a second selector for selecting an arbitrary memory cell from the selected memory cell group. The semiconductor read-only memory further includes: a first address storage circuit for storing address information of a first memory cell group; a first data storage circuit for storing first memory cell information of the first memory cell group; a second address storage circuit for storing address information in a predetermined memory cell portion of a second memory cell group; and a second data storage circuit for storing second memory cell information of the predetermined memory cell portion. The semiconductor read-only memory also includes a switching circuit for switching between information stored in the memory cell selected from the memory cell group and the memory cell information stored in the first data storage circuit or in the second data storage circuit, based on the address information stored in one of the first address storage circuit and the second address storage circuit, and outputting either the information stored in the memory cell selected from the memory cell group or the memory cell information stored in the first data storage circuit or in the second data storage circuit.

In one embodiment of the present invention, the memory cell group is a bank, and the predetermined memory cell portion includes a $½^R$ bank.

In another embodiment of the present invention, the memory cell group is a bank, and the predetermined memory cell portion includes a $½_R$ bank.

Thus, the invention described herein makes possible the advantage of providing a semiconductor ROM in which a ratio of a circuit portion for replacing defective memory cells in an entire chip area is minimized while the replacing efficiency is kept equal to or better than that of a conventional replacing circuit.

This and other advantages of the present invention will become apparent to those skilled in the art upon reading and understanding the following detailed description with reference to the accompanying figures.

DESCRIPTION OF THE PREFERRED EMBODIMENTS

Hereinafter, a semiconductor ROM of the present invention will be described by way of an illustrative example with reference to the drawings.

Figure 1:
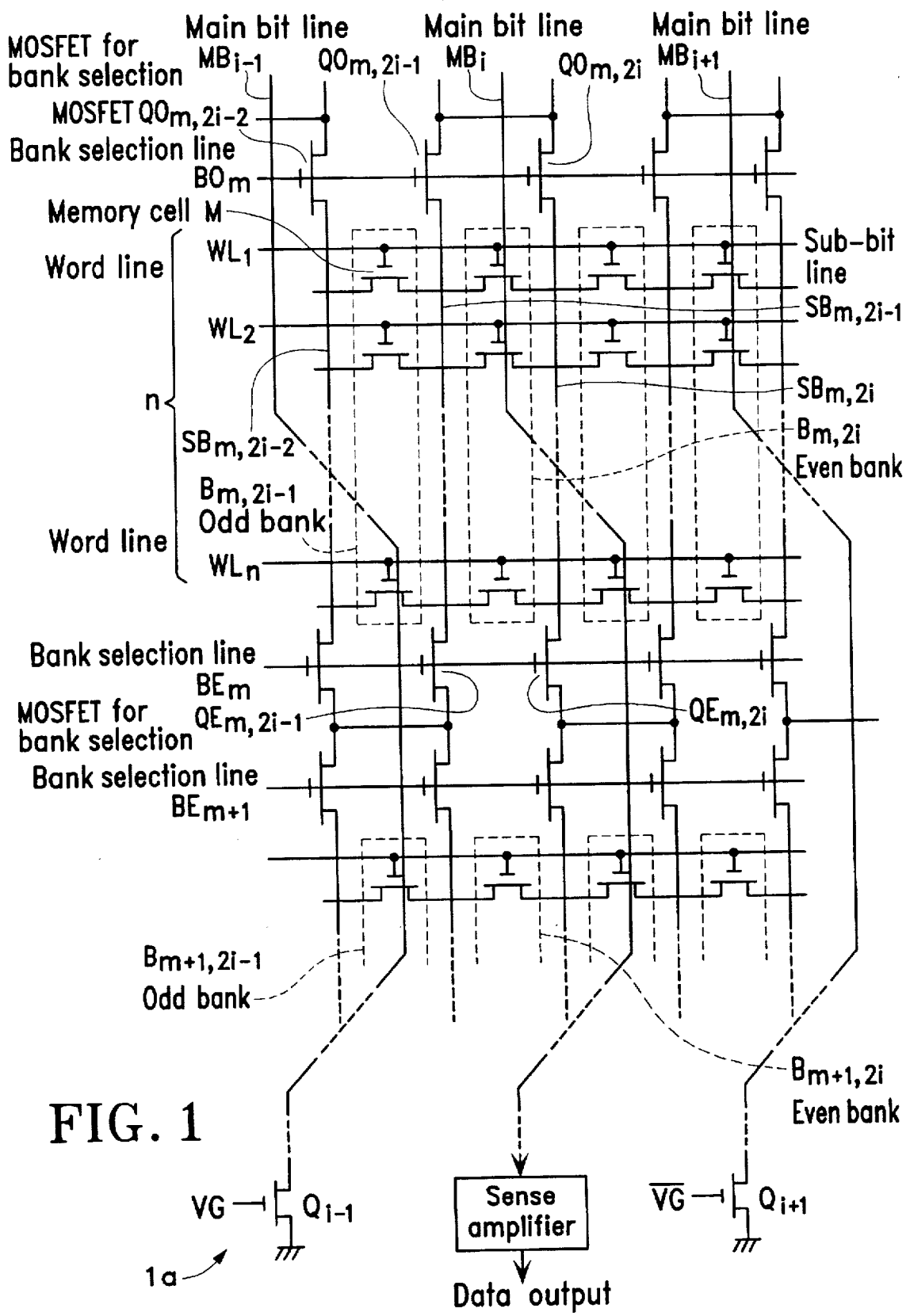
FIG. 1 is a diagram exemplifying a configuration of a conventional memory cell array of a semiconductor ROM.
Figure 2:
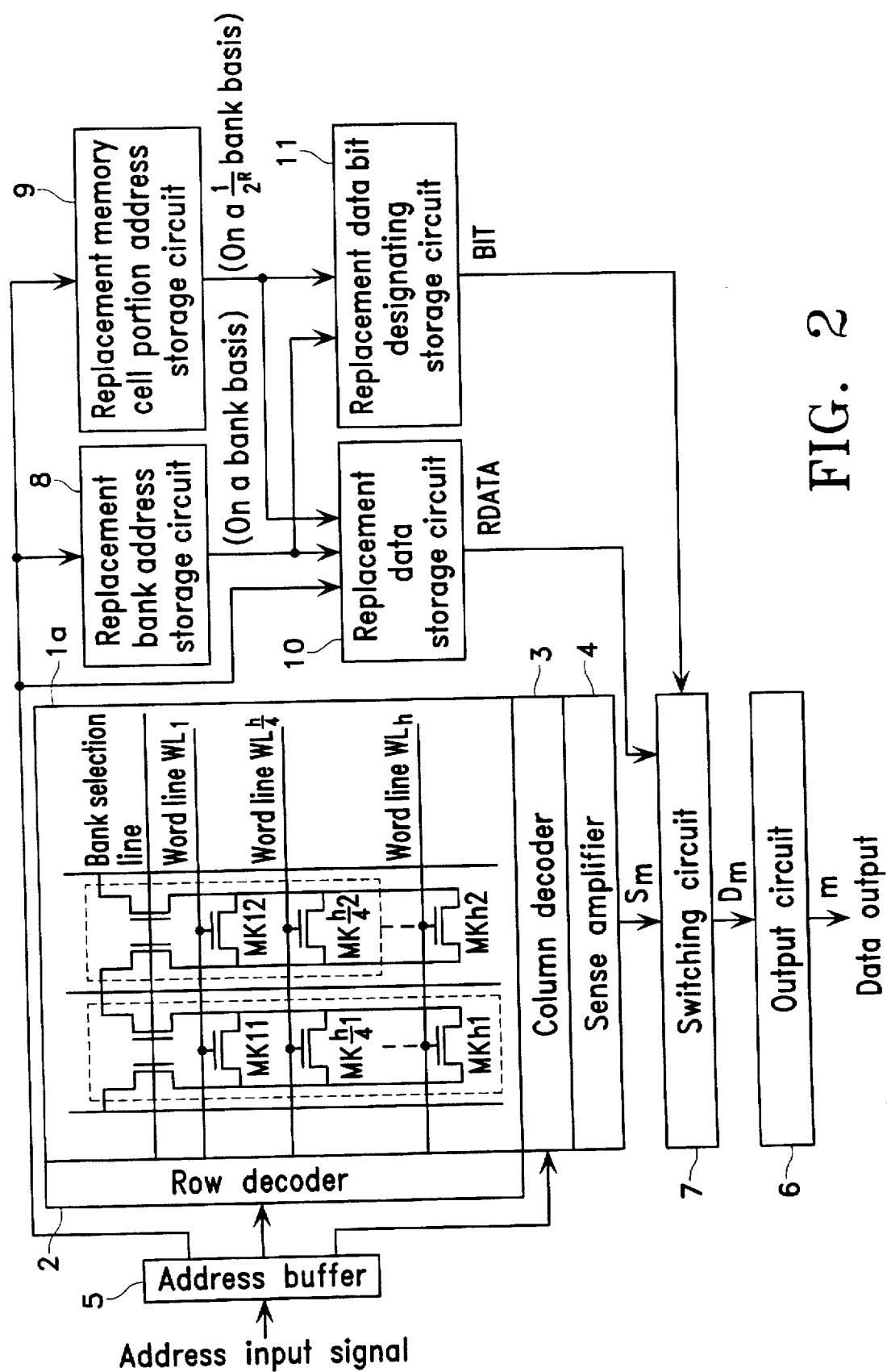
FIG. 2 is a block diagram illustrating a semiconductor ROM of the present invention.

FIG. 2 shows the entire configuration of the semiconductor ROM of the present example. As shown in FIG. 2, the semiconductor ROM includes a memory cell array $1a$ having a plurality of memory cells $MK_{11}$ to $MK_{h1}$ and $MK_{12}$ to $MK_{h2}$, an address buffer 5 receiving an address input signal from outside, a row decoder 2 and a column decoder 3 selecting a bank in the memory cell array $1a$ in accordance with an address input signal, a sense amplifier 4 amplifying data output from the selected memory cell, and an output circuit 6 outputting an output signal from the sense amplifier 4. The memory cell array $1a$ has the same configuration as that of the semiconductor ROM shown in FIG. 1 described above; therefore, its description is omitted.

When receiving an address input signal representing the address of a defective memory cell in the memory cell array $1a$, the semiconductor ROM of the present example outputs normal data previously stored in a redundancy circuit, instead of data stored in the defective memory cell. The redundancy circuit is capable of storing data of a part of a bank ($½^R$ bank, where R is a natural number e.g., 1, 2, 3, 4, and 5) which includes a defective memory cell, instead of storing the data of an entire bank including a defective memory cell. As a result, the amount of memory cells required by the redundancy circuit is significantly reduced.

For the above-mentioned purpose, the semiconductor ROM of the present example further includes a switching circuit 7 provided between the sense amplifier 4 and the output circuit 6, a replacement bank address storage circuit 8, a replacement memory cell portion ($½^R$ bank) address storage circuit 9, a replacement data storage circuit 10, and a replacement data bit designating storage circuit 11.

The switching circuit 7 receives data from the sense amplifier 4, the replacement data storage circuit 10, and the replacement data bit designating storage circuit 11. The switching circuit 7 outputs only the selected data from the sense amplifier 4, or the replacement data storage circuit 10, based on data from the replacement data bit designating storage circuit 11. More specifically, in the case where a memory cell in the memory cell array $1a$ is normal, the switching circuit 7 outputs data stored in the normal memory cell. In the case where a memory cell of the memory cell array $1a$ is defective, the switching circuit 7 outputs data stored in the replacement data storage circuit 10. The switching circuit 7 decides whether or not memory cells in the memory cell array $1a$ are normal based on a signal output from the replacement data bit designating storage circuit 11. In other words, the replacement data bit designating storage circuit 11 controls the switching circuit 7 so as not to allow it to output the data stored in the defective memory cell.

The replacement data storage circuit 10 is capable of previously storing data to be stored in a defective memory cell on a bank basis or on a $\frac{1}{2}^R$ bank basis In the case where a bank of the memory cell array 1a contains few defective memory cells, the replacement data storage circuit 10 can replace the defective memory cells contained in the bank on a $\frac{1}{2}^R$ basis. Thus, in the present example, the overall area of the replacement data storage circuit 10 storing data to be stored in a defective memory cell can be made smaller, compared with the conventional semiconductor ROM. The replacement data storage circuit 10 outputs data stored therein on a bank basis or on a $\frac{1}{2}^R$ bank basis to the switching circuit 7, based on the address signal and a signal output from the replacement bank address storage circuit 8 and/or the replacement memory cell portion ($\frac{1}{2}^R$ bank) address storage circuit 9.

The replacement bank address storage circuit 8 previously stores address information of a bank containing a defective memory cell. The replacement bank address storage circuit 8 receives an address input signal. In the case where the address input signal has address information of a defective memory cell or address information of a bank containing a defective memory cell, the replacement bank address storage circuit 8 outputs a signal representing a bank address in the replacement data storage circuit 10 storing data which was originally to be stored in the defective memory cell.

The replacement memory cell portion ($\frac{1}{2}^R$ bank) address storage circuit 9 previously stores $\frac{1}{2}^R$ bank address information of data replaced on a $\frac{1}{2}^R$ bank basis. The replacement memory cell portion ($\frac{1}{2}^R$ bank) address storage circuit 9 receives an address input signal. In the case where the address input signal has address information of a defective memory cell or address information of a $\frac{1}{2}^R$ bank containing a defective memory cell, the replacement memory cell portion ($\frac{1}{2}^R$ bank) address storage circuit 9 outputs a signal representing a $\frac{1}{2}^R$ bank address in the replacement data storage circuit 10 storing data to be stored in the defective memory cell.

The replacement data bit designating storage circuit 11 outputs a signal allowing the switching circuit 7 to decide whether or not memory cells in the memory cell array 1a are normal. Thus, the switching circuit 7 is always capable of selecting normal data, based on a signal representing a bank (e.g., a $\frac{1}{2}^R$ bank) address output from the replacement bank address storage circuit 8 and/or the replacement memory cell portion ($\frac{1}{2}^R$ bank) address storage circuit 9. In other words, the replacement data bit designating storage circuit 11 controls the switching circuit 7 so as not to allow it to output data stored in a defective memory cell.

Hereinafter, the operation of the semiconductor ROM of the present example will be outlined.

An address input signal from outside is transmitted to the row decoder 2 and the column decoder 3 for selecting a specific bank among a plurality of banks through the address buffer 5. The address input signal is also input to the replacement bank address storage circuit 8, the replacement memory cell portion ($\frac{1}{2}^R$ bank) address storage circuit 9, and the replacement data storage circuit 10 through the address buffer 5.

Figure 3:
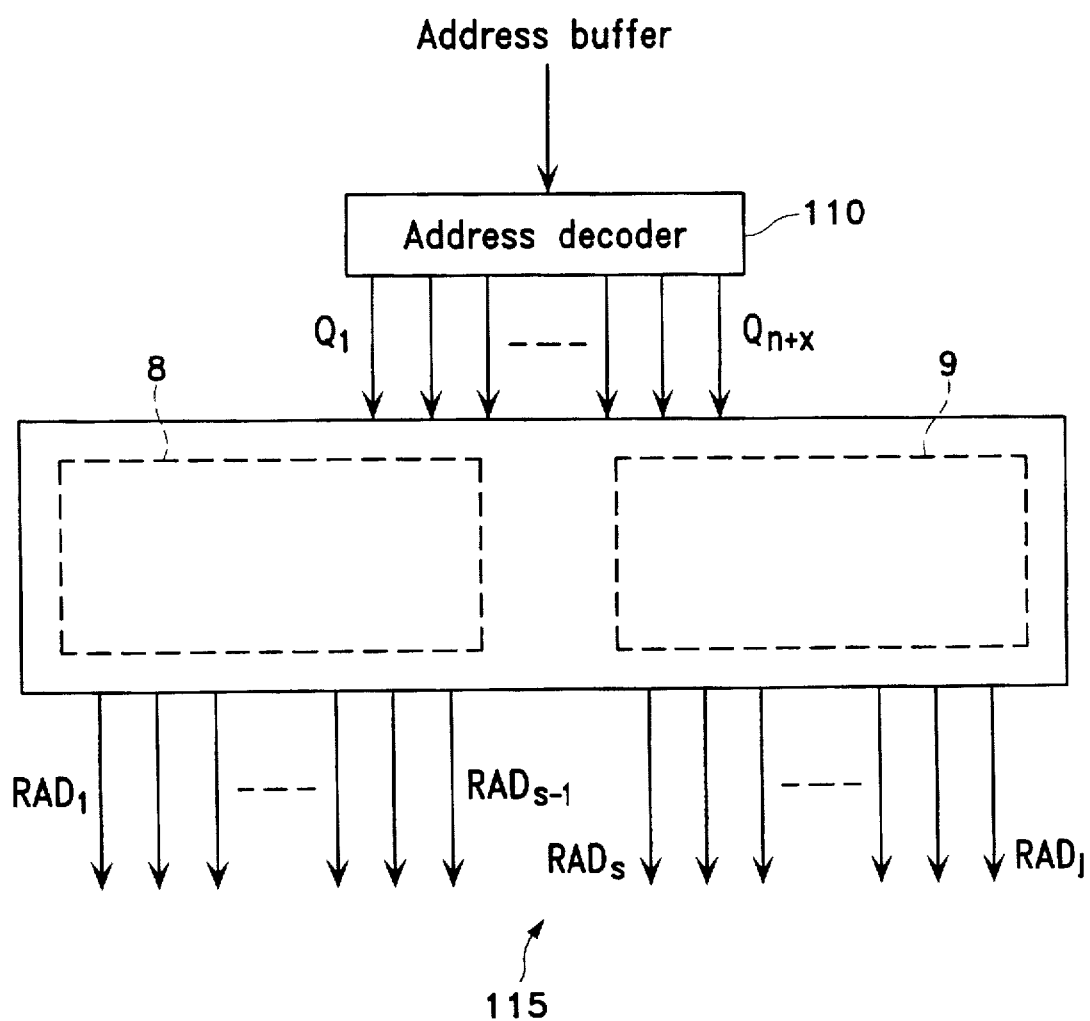
FIG. 3 is a diagram illustrating a configuration of address storage circuits of the example according to the present invention.

In the case where the address input signal has bank address information representing a bank containing a defective memory cell, the replacement bank address storage circuit 8 activates one of output signals $RAD_1$ to $RAD_{s-1}$ specifying a bank containing a memory cell storing data which was originally to be stored in the defective memory cell (see FIG. 3).

In the case where the address input signal has bank address information representing a $\frac{1}{2}^R$ bank containing a defective memory cell, the replacement memory cell portion ($\frac{1}{2}^R$) address storage circuit 9 activates one of output signals $RAD_s$ to $RAD_j$ specifying a region storing data originally to be stored in a defective memory cell. Herein, j represents the maximum number of banks which can be replaced. The maximum number of banks can be obtained by adding the number of banks (s−1) to be replaced on a bank basis to the number of banks (j−s+1) to be replaced on a $\frac{1}{2}^R$ bank basis. The values of j and s are previously determined depending upon the production process of a semiconductor ROM or the kind of the semiconductor.

The replacement data storage circuit 10 outputs data RDATA stored in the replacement data storage circuit 10 to the switching circuit 7, based on the address input signal and the active output signal RAD.

Furthermore, the active output signal RAD output from the replacement bank address storage circuit 8 or the replacement memory cell portion ($\frac{1}{2}^R$ bank) address storage circuit 9 is input to the replacement data bit designating storage circuit 11. The replacement data bit designating storage circuit 11 outputs one of the output signals BIT (e.g., $BIT_1$ to $BIT_k$) to the switching circuit 7, based on the active output signal RAD.

The switching circuit 7 generally outputs data stored in a memory cell selected by the row decoder 2 and the column decoder 3 to the output circuit 6. When receiving one of the output signals BIT and the data RDATA, the switching circuit 7 outputs the data RDATA, instead of the data stored in the memory cell selected by the row decoder 2 and the column decoder 3, to the output circuit 6. Accordingly, the semiconductor ROM of the present example is capable of outputting normal data in place of the data which was originally to be stored in a defective memory cell.

Hereinafter, the configurations and operations of the replacement bank address storage circuit 8, the replacement memory cell portion ($\frac{1}{2}^R$ bank) address storage circuit 9, the replacement data storage circuit 10, and the replacement data bit designating storage circuit 11, and the switching circuit 7 will be described.

First, the detailed configurations of the replacement bank address storage circuit 8 and the replacement memory cell portion ($\frac{1}{2}^R$ bank) address storage circuit 9 will be described.

FIG. 3 exemplifies the replacement bank address storage circuit 8 and the replacement memory cell portion ($\frac{1}{2}^R$ bank) address storage circuit 9. An address storage circuit 115 includes the replacement bank address storage circuit 8 and the replacement memory cell portion ($\frac{1}{2}^R$ bank) address storage circuit 9. In this example, the circuits 8 and 9 share an address decoder 110 as shown in FIG. 3.

The address decoder 110 receives an address input signal through the address buffer 5 (see FIG. 2). The address decoder 110 inputs output signals $Q_1$ to $Q_{n+x}$ to the address storage circuit 115 based on the address input signal. The address input signal contains information required for selecting a memory cell from the memory cell array 1a. The address decoder 110 generates the output signals $Q_1$ to $Q_{n+x}$ containing information required for selecting a particular bank or a part thereof, e.g., a $\frac{1}{2}^R$ bank, based on the address input signal.

In the case where a part of a bank is selected on a ½ bank basis, address lines $QA_1$ to $QA_{n+x}$ (collectively referred to as QA) become address lines $QA_1$ to $QA_{n+2}$. In the case where a part of a bank is selected on a ¼ (=½²) bank basis, address lines $QA_1$ to $QA_{n+x}$ become address lines $QA_1$ to $QA_{n+4}$. Here, x and R have the relationship $x=2^R$.

When receiving the output signals $Q_1$ to $Q_{n+x}$, the address storage circuit 115 activates one of output signals $RAD_1$ to $RAD_j$ based on the output signals $Q_1$ to $Q_{n+x}$. The output signals $RAD_1$ to $RAD_j$ specify data stored in the replacement data storage circuit 10 on a bank basis or on a ½$^R$ bank basis. More specifically, the output signals $RAD_1$ to $RAD_{s-1}$ designate the addresses of banks stored in the replacement data storage circuit 10, and the output signals $RAD_s$ to $RAD_j$ designate the addresses of ½$^R$ banks stored in the replacement data storage circuit 10.

In the case where a defective memory cell is not required to be replaced on a bank basis, the address storage circuit 115 is not required to generate and output the output signals $RAD_1$ to $RAD_{s-1}$.

In the arrangement of the replacement bank address storage circuit 8 and the replacement memory cell portion (½$^R$ bank) address storage circuit 9 as shown in FIG. 2, the circuits 8 and 9 share the address decoder 110. In this case, the replacement bank address storage circuit 8 shown in FIG. 2 receives the output signals $Q_1$ to $Q_n$ and activates one of the output signals $RAD_1$ to $RAD_{s-1}$ based on the output signals $Q_1$ to $Q_n$. The replacement memory cell portion (½$^R$ bank) address storage circuit 9 shown in FIG. 2 receives the output signals $Q_1$ to $Q_{n+x}$ and activates one of the output signals $RAD_s$ to $RAD_j$ based on the output signals $Q_1$ to $Q_{n+x}$.

As described above, in the case where a defective memory cell is not required to be replaced on a bank basis, the semiconductor ROM of the present example is not required to have the replacement bank address storage circuit 8.

Figure 4:
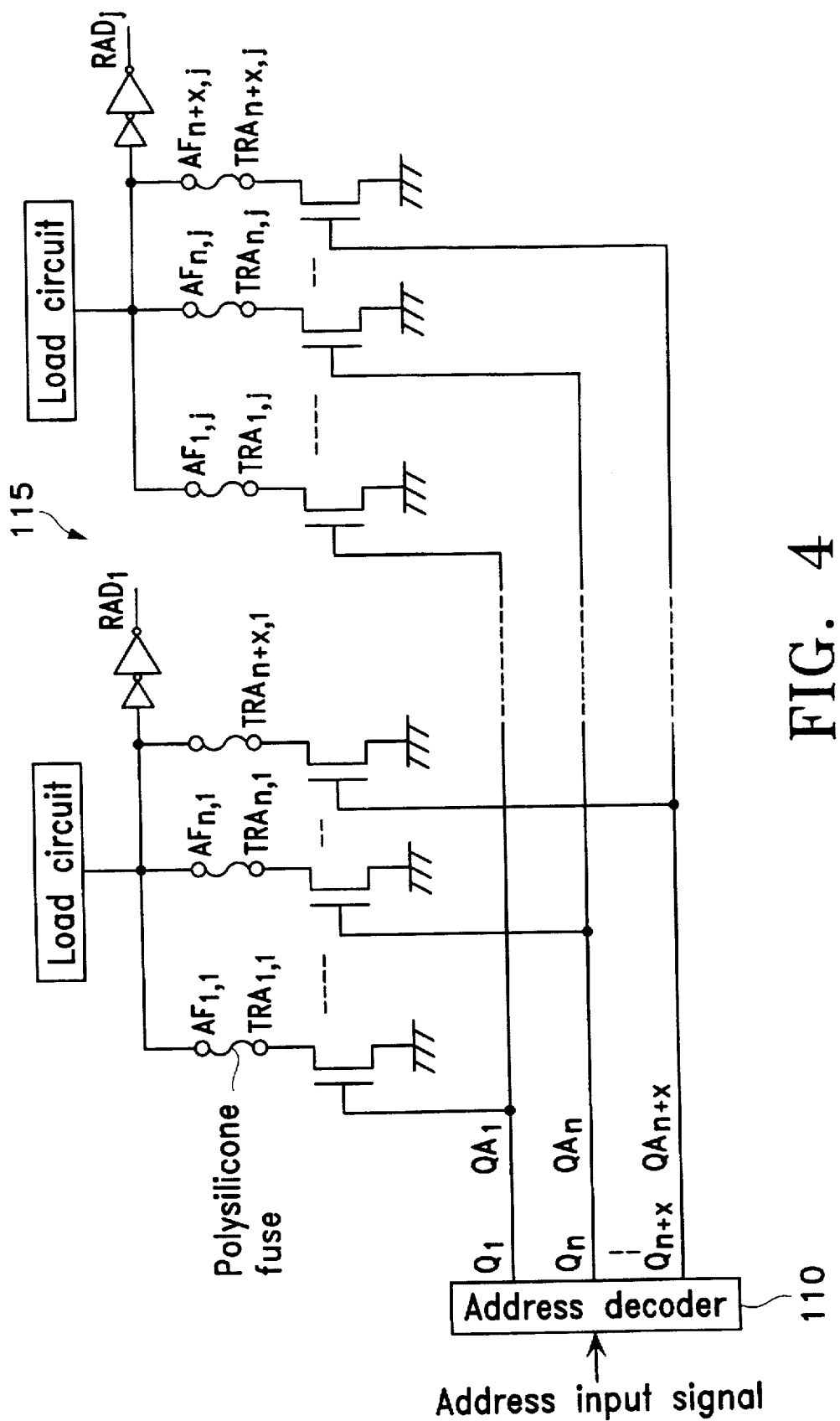
FIG. 4 is a diagram illustrating a detailed configuration of the address storage circuit of the example according to the present invention.

Hereinafter, the detailed configuration of the address storage circuit 115 will be described with reference to FIG. 4.

The address storage circuit 115 includes the address decoder 110, a plurality of transistors $TRA_{1,1}$ to $TRA_{n+x,j}$ (collectively referred to as TRA), a plurality of polysilicon fuses $AF_{1,1}$ to $AF_{n+x,j}$ (collectively referred to as AF), a plurality of load circuits, and a plurality of two-stage inverters. The address lines $QA_1$ to $QA_{n+x}$ extend from the address decoder 110. The address lines $QA_1$ to $QA_{n+x}$ are connected to the corresponding transistors TRA, respectively. One end of the source/drain of each transistor TRA is connected to one corresponding end of the polysilicon fuse AF. The other end of each polysilicon fuse AF is connected to the corresponding two-stage inverter and load circuit connected in series. The other end of the source/drain of each transistor TRA is grounded.

In the case where a defective memory cell is not required to be replaced on a bank basis, the address decoder 110 and the replacement data storage circuit 10 (the configuration of which will be described later) to which an active output signal RAD is input may be altered. More specifically, in the case where the address input signal to be input through the address buffer has an address of a ½$^R$ bank containing a defective memory cell, it suffices that the address storage circuit 115 specifies the bank of the replacement data storage circuit 10 storing data to be replaced. Thus, it is not required to alter the configurations of the transistors $TRA_{1,1}$ to $TRA_{n+x,j}$, polysilicon fuses $AF_{1,1}$ to $AF_{n+x,j}$, load circuits, and two-stage inverters.

Hereinafter, the operation of the address storage circuit 115 will be described.

The address decoder 110 activates at least one of the output signals $Q_1$ to $Q_{n+x}$. The transistors TRA connected to the address lines QA through which the active output signals are transmitted become conductive. As a result, the electric potentials of electrodes of the transistors TRA connected to the polysilicon fuses AF reach a ground level. This does not allow an output signal at a high level to be output from the corresponding two-stage inverter. In order to allow an output signal at a high level to be output from the two-stage inverter, the polysilicon fuses corresponding to the transistors which become conductive are previously cut, for example, with a laser beam.

In the case where a defective memory cell is present in the memory cell array 1a, at least one of the polysilicon fuses $AF_{1,1}$ to $AF_{n,1}$ and $AF_{1,j}$ to $AF_{n+x,j}$ are cut with a laser beam depending upon the memory cell group to which the defective memory cell belongs, thereby storing data, which should have been stored in the defective memory cell, in a normal memory cell. The information of the defective memory cell such as an address is known by previously testing the semiconductor ROM. Thus, the address information of the bank (or ½$^R$ bank) containing the defective memory cell can be stored in the address storage circuit 115.

In the case where the data, which should have been stored in the defective memory cell, is stored in the normal memory cell on a bank basis and the data stored in the normal memory cell is accessed (excluding the case where the data which should have been stored in the defective memory cell is stored in the normal memory cell on a ½$^R$ bank basis), the output signals $RAD_s$ to $RAD_j$ become low. More specifically, only the replacement bank address storage circuit 8 outputs the active output signal RAD (at least one of the output signals $RAD_1$ to $RAD_{s-1}$) representing the address information on a bank basis to the replacement data storage circuit 10 and the replacement data bit designating storage circuit 11.

Figure 5:
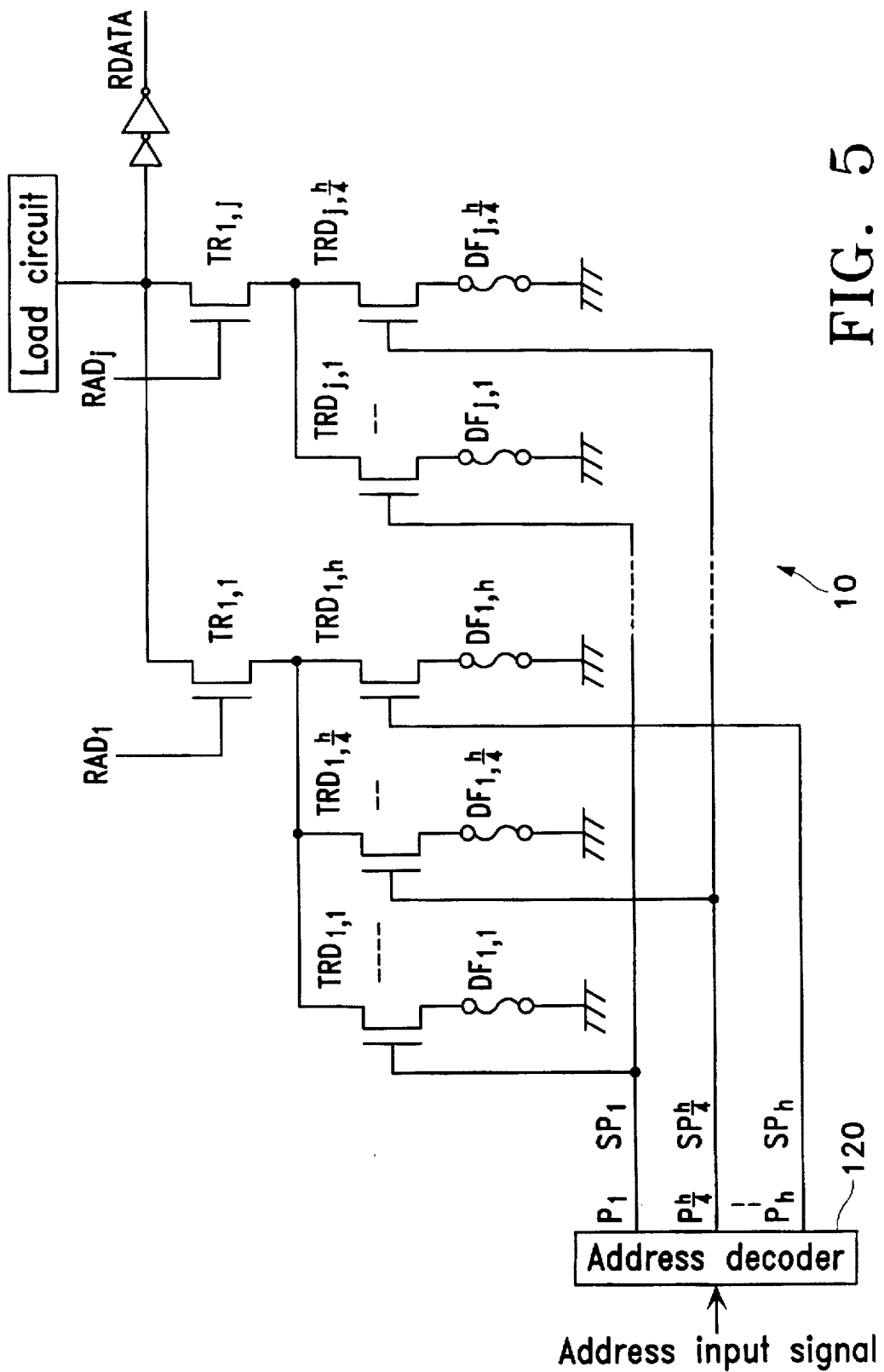
FIG. 5 is a diagram illustrating a configuration of a replacement data storage circuit of the example according to the present invention.

Hereinafter, the replacement data storage circuit 10 will be described with reference to FIG. 5. The replacement data storage circuit 10 stores the memory cell information of each memory cell group to be replaced.

The replacement data storage circuit 10 includes an address decoder 120, a plurality of first transistors $TR_{1,1}$ to $TR_{1,j}$ (collectively referred to as TR), a plurality of second transistors $TRD_{1,1}$ to $TRD_{1,h}$ and $TRD_{j,1}$ to $TRD_{j,h/4}$ (collectively referred to as TRD), a plurality of polysilicon fuses $DF_{1,1}$ to $DF_{1,h}$ and $DF_{j,1}$ to $DF_{j,h/4}$ (collectively referred to as DF), a load circuit, and a two-stage inverter. In the replacement data storage circuit 10 shown in FIG. 5, it is assumed that a defective memory cell is replaced on a ¼ bank basis.

The replacement data storage circuit 10 receives an address input signal from the address buffer 5 and outputs signals $RAD_1$ to $RAD_j$ from the replacement bank address storage circuit 8 and/or the replacement memory cell portion (½$^R$ bank) address storage circuit 9. The address input signal and the output signals $RAD_1$ to $RAD_j$ are used for selecting data stored in a memory cell group (i.e., bank) and/or a memory cell portion (i.e., ½$^R$ bank) storing data to be stored in a defective memory cell. This enables the data, which should have been stored in the defective memory cell, to be accessed from a replaced normal memory cell. In other words, the replacement data storage circuit 10 is capable of accessing the data RDATA, which has already been stored, in accordance with the address input signal and the active output signal RAD (e.g., one of $RAD_1$ to $RAD_j$). The data RDATA which should have been stored in the defective memory cell is output from the two-stage inverter.

Hereinafter, the operation of the replacement data storage circuit 10 will be described in detail.

The address decoder 120 receives the address input signal and outputs signals $P_1$ to $P_h$ to corresponding lines $SP_1$ to $SP_h$, respectively. The signals $P_1$ to $P_h$ are input to gate electrodes of the corresponding second transistors TRD. The first transistors $TR_{1,1}$ to $TR_{1,j}$ receive the active output signal RAD (e.g., one of $RAD_1$ to $RAD_j$) from the replacement bank address storage circuit 8 and/or the replacement memory cell portion address storage circuit 9.

For example, it is assumed that only the first transistor $TR_{1,1}$ and the second transistor $TRD_{1,1}$ become conductive. In the case where the polysilicon fuse $DF_{1,1}$ is cut, a signal having a high level is output from the two-stage inverter. In the case where the polysilicon fuse $DF_{1,1}$ is not cut, a signal having a high level is not output from the two-stage inverter. Thus, the combination of the first transistor TR, the second transistor TRD, and the polysilicon fuse DF determines a signal to be output from the two-stage inverter.

The configuration of the replacement data storage circuit 10 will be described in detail. The configuration of the replacement data storage circuit 10 is varied depending upon whether the data which should have been stored in a defective memory cell is stored in a normal memory cell on a bank basis or on a $\frac{1}{2}^R$ bank basis.

A circuit portion receiving the output signal from the address storage circuit 8 (e.g., the output signal $RAD_1$) will be described below.

In the case where a bank unit having a defective memory cell is composed of 64 bits, it is required to store 64 bits of memory cell information. In the replacement data storage circuit 10, one circuit element for storing memory cell information which should have been stored in a defective memory cell has 64 second transistors TRD and 64 polysilicon fuses DF. One end of the second transistor TRD is connected in series to one end of the polysilicon fuse DF. The other end of the polysilicon fuse DF is grounded The other end of the second transistor TRD is connected to one end of the first transistor $TR_{1,1}$. The gate of the first transistor $TR_{1,1}$ receives the output signal $RAD_1$ (output signal from the address storage circuit 8 for conducting the above-mentioned replacement on a bank basis).

A circuit portion receiving the output signal from the address storage circuit 9 (e.g., the output signal $RAD_j$) will be described below.

In the case where a bank unit to be replaced is a ¼ bank, one circuit element in the replacement data storage circuit 10 has 16 second transistors TRD and 16 polysilicon fuses DF. One end of the second transistor TRD is connected in series to one end of the polysilicon fuse DF, and the other end of the polysilicon fuse DF is grounded. The other end of the second transistor TRD is connected to one end of the first transistor TR. The gate of the first transistor $TR_{1,j}$ receives the output signal $RAD_j$ (output signal from the address storage circuit 9 for conducting the above-mentioned replacement on a $\frac{1}{2}^R$ bank basis).

In the case where the semiconductor ROM of the present invention is not provided with the replacement bank address storage circuit 8, a circuit portion receiving the output signal from the address storage circuit 8 is not required as long as the replacement data storage circuit 10 has a circuit portion receiving the output signal from the address storage circuit 9.

When the word line $WL_1$ (FIG. 2) is selected, the output signal $P_1$ from the address decoder 120 (FIG. 5) becomes active (a high level). When the word line $WL_h$ is selected, the output $P_h$ becomes active (a high level). Each portion of the memory cell information in a bank to be replaced or in a memory cell portion ($\frac{1}{2}^R$ bank) to be replaced is stored by previously conducting cutting/noncutting of the polysilicon fuses $DF_{1,1}$ to $DF_{1,h}$ ... $DF_{j,1}$ to $DF_{j,h/4}$ with a laser beam, in accordance with storage information "1"/"0" of memory cells $M_{k,1,1}$ to $M_{k,h,1}$ in a defective bank k or of memory cells $M_{k,l,2}$ to $M_{k,h/4,2}$ in a defective bank adjacent to the bank k.

The case where the bank unit is composed of 64 bits has been described above. In the case where the bank unit is composed of 32 bits, the number of the polysilicon fuses DF and that of the second transistors TRD are half of those of the bank unit of 64 bits. The number of the first transistors TR is determined by a number j of the output signals RAD, so that the number of the first transistors TR is not affected by the changes in the bit number of the bank unit.

Figure 6:
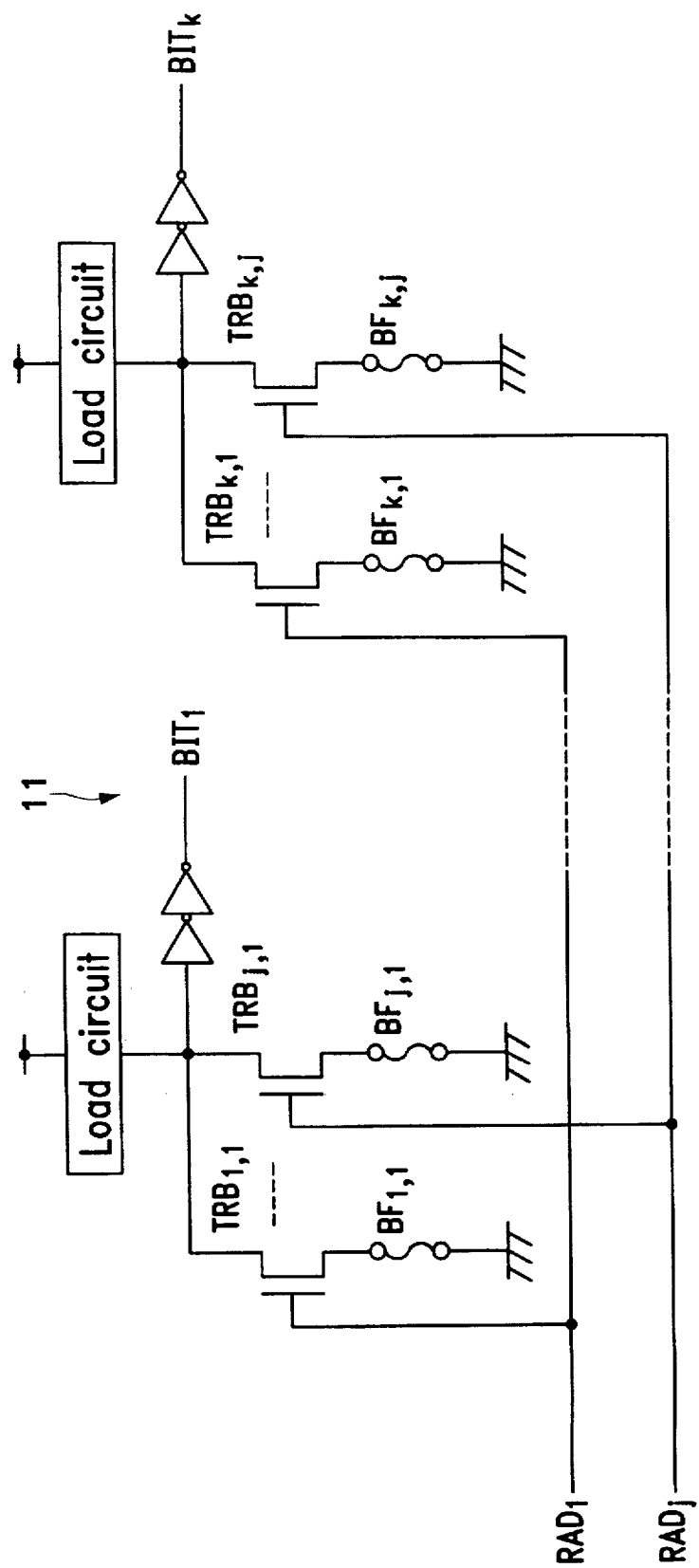
FIG. 6 is a diagram illustrating a configuration of a replacement data bit designating storage circuit of the example according to the present invention.

FIG. 6 exemplifies the replacement data bit designating storage circuit 11. As shown in this figure, the replacement data bit designating storage circuit 11 includes a plurality of lines receiving output signals $RAD_1$ to $RAD_j$, a plurality of transistors $TRB_{1,1}$ to $TRB_{j,1}$ ..., $TRB_{k,1}$ to $TRB_{k,j}$ corresponding to the lines, a plurality of load circuits, polysilicon fuses $BF_{1,1}$ to $BF_{j,1}$ ... $BF_{k,1}$ to $BF_{k,j}$, and two-stage inverters. One end of the source/drain of the transistor TRB is grounded through the polysilicon fuse BF. Any one of the polysilicon fuses $BF_{1,1}$ to $BF_{j,1}$ ..., $BF_{k,1}$ to $BF_{k,j}$ is previously cut with a laser beam. This activates one of the output signals $BIT_1$ to $BIT_k$.

The replacement data bit designating storage circuit 11 receives the active output signal RAD (e.g., one of $RAD_1$ to $RAD_j$) from the replacement bank address storage circuit 8 and the replacement memory cell portion ($\frac{1}{2}^R$ bank) address storage circuit 9. The replacement data bit designating storage circuit 11 outputs one of the output signals $BIT_1$ to $BIT_k$ based on the received active output signal RAD (e.g., one of $RAD_1$ to $RAD_j$).

Figure 7:
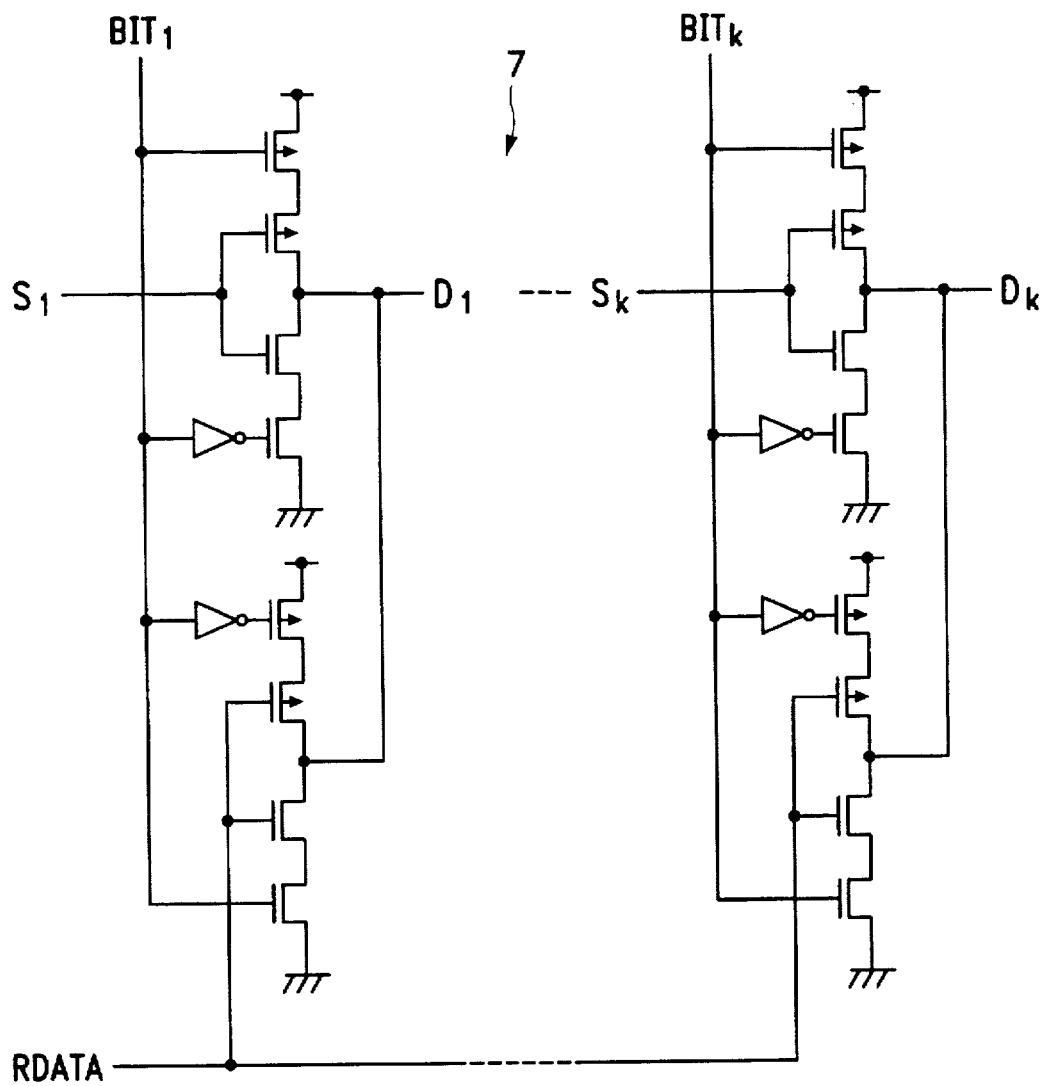
FIG. 7 is a diagram illustrating a configuration of a switching circuit of the example according to the present invention.
Figure 8:
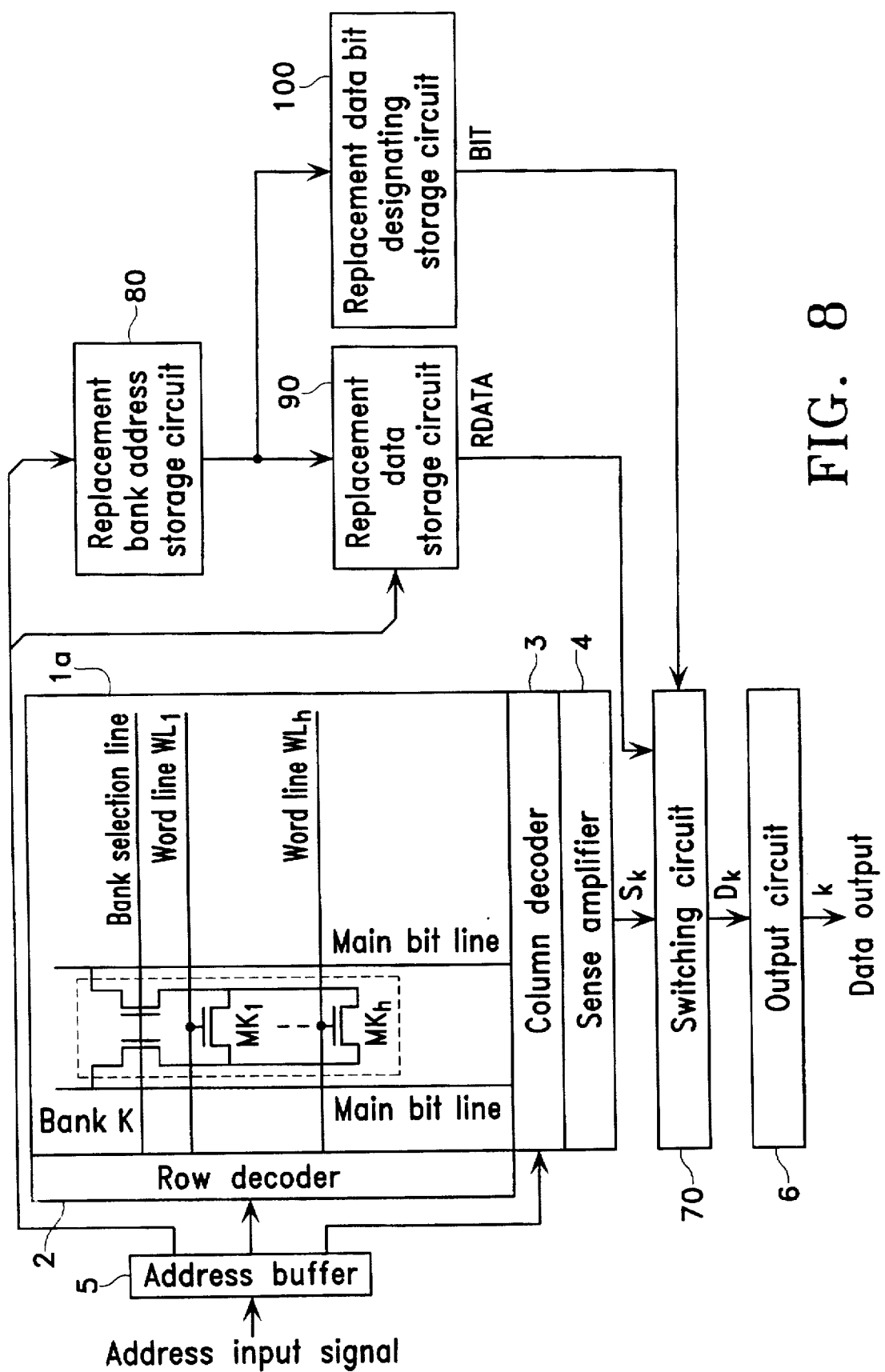
FIG. 8 is a block diagram illustrating a conventional redundancy circuit.

FIG. 7 exemplifies the switching circuit 7. The switching circuit 7 receives a sense amplifying output $S_k$ from the sense amplifier 4, the output data RDATA from the replacement data storage circuit 10, and the signal $BIT_k$ from the replacement data bit designating storage circuit 11. The switching circuit 7 masks the output signal $S_k$ from the sense amplifier 4 which is information read from the defective memory cell, in accordance with the received output signal $BIT_k$, and outputs the data RDATA from the replacement data storage circuit 10 to the output circuit 6 as an output signal $D_k$. The same operation is conducted in the case where other memory cells in a certain bank are accessed. Furthermore, the same operation is conducted even on a predetermined memory cell portion ($\frac{1}{2}^R$ bank) basis, instead of a bank basis.

The operation principle of a replacing circuit is basically the same irrespective of whether the operation is conducted on a bank basis or on the basis of a memory cell portion in a bank (i.e., $\frac{1}{2}^R$ bank). However, a unit to be replaced varies depending upon the address information in the address storage circuit. More specifically, the number of memory cells rewriting memory cell information varies depending upon the address information, so that the number of polysilicon fuses for writing memory cell information in the data storage circuit also varies.

Thus, in the present example, even in the case where defects are caused in several bits of memory cells $M_{k,1,1}$ to $M_{k,h,1}$ connected to the same sub-bit line, which are not related to the defects of the sub-bit line, it is not necessary to replace all the memory cells connected to the sub-bit line. This reduces the size of replacing circuits. Furthermore, the number of polysilicon fuses to be cut for the purpose of writing memory cell information is small, so that the cutting time, for example, with a laser beam, can be reduced to a fraction of the time, compared with the conventional replacement on a bank basis.

The polysilicon fuses can be cut electrically, instead of using a laser beam.

A replacing circuit on a memory cell portion ($\frac{1}{2}^R$ bank) basis only, may be provided A replacing circuit on a bank basis may be provided together with a replacing circuit on a memory cell portion ($\frac{1}{2}^R$ bank) basis. The arrangement of a replacing circuit may be determined based on the data statistically obtained in the past. The statistical tendency may be varied depending upon the process or the memory cell capacity.

In the semiconductor ROM of the present invention, data which should have been stored in a defective memory can be stored in a normal memory cell on a memory cell portion ($\frac{1}{2}^R$ bank) basis. Therefore, in the case where the ratio of defects caused by a memory cell itself is higher than that caused by a sub-bit line, the replacing efficiency can be improved in the semiconductor ROM of the present invention, compared with the conventional semiconductor ROM replacing a defective memory cell only on a bank basis. This decreases the ratio of replacing circuits in the entire semiconductor ROM. Thus, the wiring delay can be minimized.

In the semiconductor ROM of the present invention, data which should have been stored in a defective memory can be stored in a normal memory cell on a memory cell portion ($\frac{1}{2}^R$ bank) basis or on a bank basis. Therefore, even in the case where defects caused by a memory cell itself as well as those caused by a sub-bit line occur, a more satisfactory replacing efficiency can be obtained, compared with the conventional semiconductor ROM replacing a defective memory cell only on a bank basis.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor read-only memory including a plurality of memory cell groups each having a plurality of memory cells, a first selector for selecting an arbitrary memory cell group from the plurality of memory cell groups, and a second selector for selecting an arbitrary memory cell from the selected memory cell group, comprising:

an address storage circuit for storing address information of a predetermined memory cell portion in the memory cell group, the memory cell group being a bank, and the predetermined memory cell portion including a $\frac{1}{2}^R$ bank, wherein R is an integer greater than 0;

a data storage circuit for storing memory cell information of the predetermined memory cell portion; and a switching circuit for switching between information stored in the memory cell selected from the memory cell group and the memory cell information stored in the data storage circuit, based on the address information, and outputting either the information stored in the memory cell selected from the memory cell group or the memory cell information stored in the data storage circuit.

2. A semiconductor read-only memory including a plurality of memory cell groups each having a plurality of memory cells, a first selector for selecting an arbitrary memory cell group from the plurality of memory cell groups, and a second selector for selecting an arbitrary memory cell from the selected memory cell group, comprising:

a first address storage circuit for storing address information of a predetermined memory cell portion of a first memory cell group;

a first data storage circuit for storing first memory cell information of the predetermined memory cell portion of the first memory cell group;

a second address storage circuit for storing address information in a predetermined memory cell portion of a second memory cell group;

a second data storage circuit for storing second memory cell information of the predetermined memory cell portion;

wherein at least one of the first memory cell group and the second memory cell group is a bank and at least one of the predetermined memory cell portion of the first memory cell group and the predetermined memory cell portion of the second memory cell group is a $\frac{1}{2}^R$ bank, wherein R is an integer greater than 0; and a switching circuit for switching between information stored in the memory cell selected from the memory cell group and the memory cell information stored in the first data storage circuit or in the second data storage circuit, based on the address information stored in one of the first address storage circuit and the second address storage circuit, and outputting either the information stored in the memory cell selected from the memory cell group or the memory cell information stored in the first data storage circuit or in the second data storage circuit.

3. A semiconductor read-only memory, comprising:

a bank of memory cells; and a redundancy circuit operative to provide the semiconductor read-only memory with normal data in place of data from a defective memory cell upon the semiconductor read-only memory cell receiving an address input signal representing an address of the defective memory cell, the redundancy circuit capable of storing data of a portion of the baik of memory cells, the portion of the bank of memory cells including the defective memory cell wherein the portion of the bank of memory cells is a $\frac{1}{2}^R$ bank, wherein R is an integer greater than 0.

4. The semiconductor read-only memory of claim 3, further including a replacement data storage circuit for storing data replacing the data from the defective memory cell;

a switching circuit for outputting either the data from a memory cell or data from the replacement data storage circuit; and a replacement data bit storage circuit operative to generate a signal indicative of whether or not the memory cell is defective;

wherein the switching circuit will output data from the replacement data storage circuit if the signal is indicative of the memory cell being defective.

5. The semiconductor read-only memory of claim 4, wherein the replacement data storage circuit is capable of previously storing data to be stored in the defective memory cell on a bank basis or on a $½^R$ bank basis.

6. A method of storing data in a semiconductor read-only memory by using a redundancy circuit, the method comprising the steps of:

- receiving an address input signal representing an address of a defective memory cell included in a portion of a bank of memory cells
- storing data of the portion of the bank of memory cells in a redundancy circuit; and
- providing the semiconductor read-only memory with normal data stored in the redundancy circuit in place of data from the defective memory cell;

wherein the portion of the bank of memory cells is a $½^R$ bank, wherein R is an integer greater than 0.

7. The method of storing data in a semiconductor read-only memory of claim 6, the method further comprising the steps of:

- replacing data from the defective memory cell with normal data by storing the normal data in a replacement data storage circuit;
- generating a signal indicative of whether or not a memory cell is defective; and
- outputting data from the replacement data storage circuit if the signal is indicative of the memory cell being defective.

* * * * *